United States Patent
Sivaperumal et al.

(10) Patent No.: US 9,013,030 B2
(45) Date of Patent: Apr. 21, 2015

(54) LEADFRAME, SEMICONDUCTOR PACKAGE INCLUDING A LEADFRAME AND METHOD FOR PRODUCING A LEADFRAME

(71) Applicant: Infineon Technologies AG, Neubiberg (DE)

(72) Inventors: Seliyan Sivaperumal, Johor (MY); Wai Win Edwin Liew, Ipoh (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/852,058

(22) Filed: Mar. 28, 2013

(65) Prior Publication Data
US 2014/0291824 A1    Oct. 2, 2014

(51) Int. Cl.
*H01L 23/495*    (2006.01)

(52) U.S. Cl.
CPC .... *H01L 23/49541* (2013.01); *H01L 23/49582* (2013.01); *H01L 2224/32245* (2013.01); *H01L 2224/48091* (2013.01); *H01L 2224/48247* (2013.01); *H01L 2224/48464* (2013.01); *H01L 2224/73265* (2013.01)

(58) Field of Classification Search
USPC .................................................. 257/676, 666
See application file for complete search history.

(56) References Cited

U.S. PATENT DOCUMENTS 5,729,894 A * 3/1998 Rostoker et al. ................. 29/832

* cited by examiner

*Primary Examiner* — Long Pham
(74) *Attorney, Agent, or Firm* — Murphy, Bilak & Homiller, PLLC

(57) ABSTRACT

A lead frame includes a die pad and a lead finger with an inner portion which is configured to be electrically connected to contact pads of a die and with an outer portion which has an attach portion. The attach portion is configured to be soldered to an external solder pad, wherein the attach portion has a width, a length and a thickness. An opening extends through the thickness of the attach portion.

9 Claims, 4 Drawing Sheets

LEADFRAME, SEMICONDUCTOR PACKAGE INCLUDING A LEADFRAME AND METHOD FOR PRODUCING A LEADFRAME

TECHNICAL FIELD

The invention generally relates to lead frames and to semiconductor packages including a lead frame. The invention further relates to methods for producing a lead frame. In particular, the invention relates to a lead frame including a die pad and lead fingers.

BACKGROUND

A lead frame provides a possibility to assure electrical connections between a semiconductor chip and the outside of a package which houses the semiconductor chip or die. A lead frame generally includes a die pad and a plurality of lead fingers.

A semiconductor die or chip is attached to the die pad and electrical connections between contact pads on the die and inner portions of the lead fingers are provided, for example by bond wires. After the electrical connection, a package may be formed, e.g. by molding a housing in a molding process. The housing encapsulates the die. An outer portion of the lead fingers extends out of the housing. The outer portion of the lead finger includes an attach portion which may be soldered to an external circuit such as a printed circuit board.

The attach portion of a lead finger should allow for a secure solder connection between the semiconductor package and the external circuit withstanding multiple temperature cycles.

Due to differences in the coefficients of thermal expansion of the semiconductor package and the external circuit to which the semiconductor package is soldered, cracks may arise in the solder joint leading to an increased resistance or even to an electrical disconnection between semiconductor package and external circuit.

SUMMARY

According to an embodiment of a lead frame, the lead frame comprises a die pad configured to accommodate a die and a lead finger. The lead finger comprises an inner portion configured to be electrically coupled to contact pads of the die and an outer portion comprising an attach portion at an end of the lead finger facing away from the inner portion. The attach portion is configured to be soldered to an external solder pad. The attach portion comprises a first width, a length and a thickness. An opening extends through the thickness of the attach portion.

According to an embodiment of a method for producing a lead frame, the method comprises: providing a die pad configured to accommodate a die; providing a lead finger, the lead finger comprising: an inner portion configured to be electrically coupled to contact pads of the die; and an outer portion comprising an attach portion at an end of the lead finger facing away from the inner portion, the attach portion being configured to be soldered to an external solder pad, wherein the attach portion comprises a width, a length and a thickness; and providing an opening which extends through the thickness of the attach portion.

According to an embodiment of a semiconductor package, the semiconductor package comprises a lead frame. The lead frame comprises a die pad configured to accommodate a die and a lead finger. The lead finger comprises an inner portion configured to be electrically coupled to contact pads of the die and an outer portion comprising an attach portion at an end of the lead finger facing away from the inner portion. The attach portion is configured to be soldered to an external solder pad. The attach portion comprises a first width, a length and a thickness. An opening extends through the thickness of the attach portion. The semiconductor package further comprises a die attached to the die pad and electrically coupled to the inner portion of the lead finger, and a housing encapsulating the die and the inner portion of the lead finger.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this description. The drawings illustrate embodiments and together with the description serve to explain principles of embodiments. Other embodiments and many of the intended advantages of embodiments will be readily appreciated as they become better understood by reference to the following detailed description.

DETAILED DESCRIPTION

Figure 1:
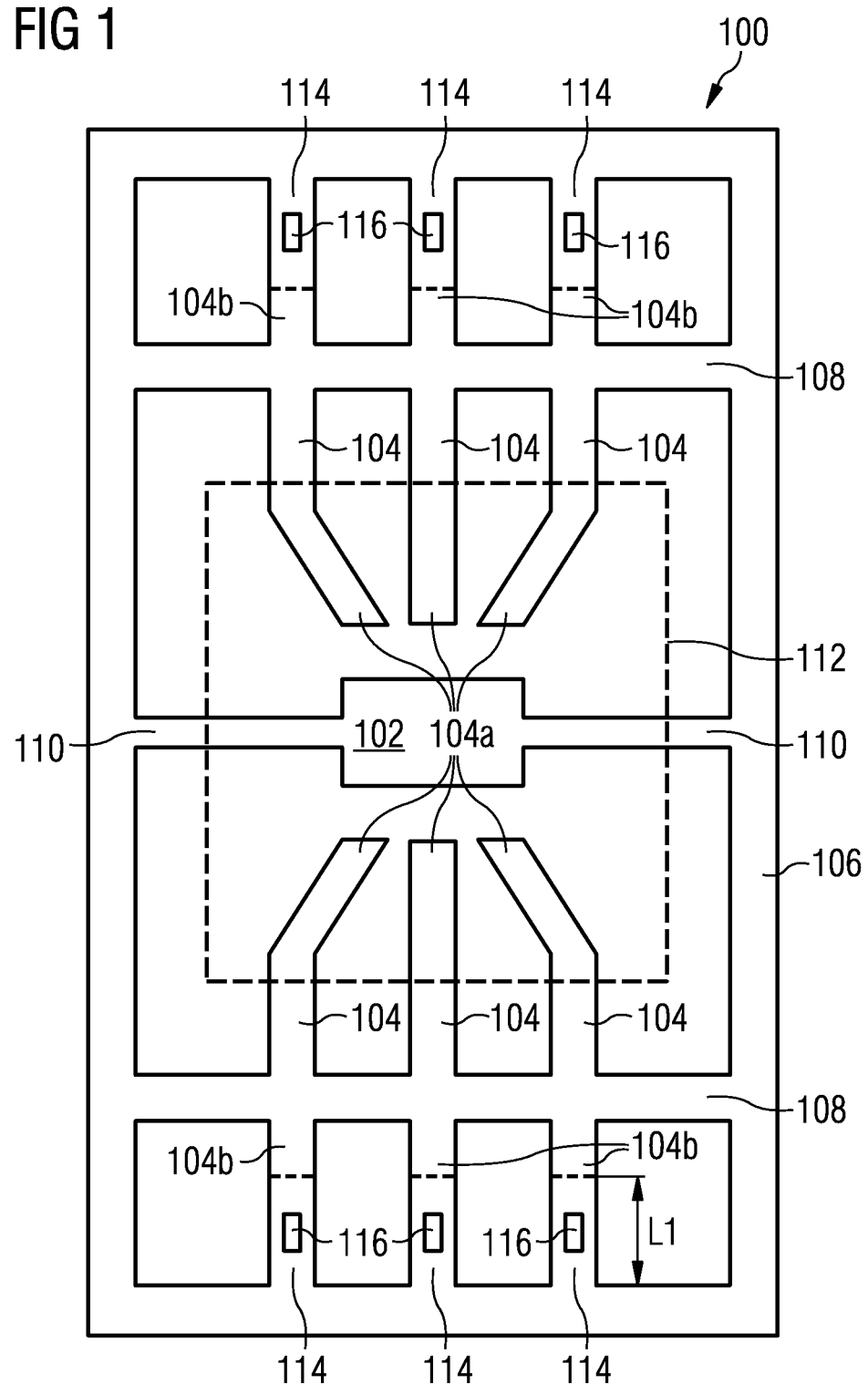
FIG. 1 schematically illustrates a lead frame according to a first embodiment.

In the following, embodiments are described with reference to the drawings wherein like reference numerals are generally utilized to refer to like elements throughout. In the following description, for purposes of explanation, numerous specific details are set forth in order to provide a thorough understanding of one or more aspects of embodiments. However, it may be evident to a person skilled in the art that one or more aspects of the embodiments may be practiced with a lesser degree of these specific details. The following description is therefore not to be taken in a limiting sense, and the scope of protection is defined by the appended claims.

The various aspects summarized may be embodied in various forms. The following description shows by way of illustration various combinations and configurations in which the aspects may be practiced. It is understood that the described aspects and/or embodiments are merely examples and that other aspects and/or embodiments may be utilized and structural and functional modifications may be made without departing from the scope of the present disclosure. In addition, while a particular feature or aspect of an embodiment may be disclosed with respect to only one of several implementations, such feature or aspect may be combined with one or more other features or aspects of the other implementations as it may be desired and advantageous for any given or particular application. Further, to the extent that the terms "include", "have", "with" or other variants thereof are used in either the detailed description or the claims, such terms are intended to be inclusive in a manner similar to the term "comprise". Also, the term "exemplary" is merely meant as an example, rather than the best or optimal.

FIG. 1 shows schematically a lead frame 100. The lead frame 100 includes a die pad 102 and six lead fingers 104. The die pad 102 and the lead fingers 104 are surrounded by an outer support frame 106 to which the lead fingers 104 are connected. Support bars 108 further interconnect the lead fingers 104 and are connected to the outer support frame 106. Die pad support bars 110 connect the die pad 102 to the outer support frame 106.

The support bars 108 and 110 as well as the outer support frame 106 hold the die pad 102 and the lead fingers 104 together during production. They are removed at the end of the manufacturing process and partly during the manufacturing process to create a free-standing die pad 102 and separate lead fingers 104.

In the first embodiment shown in FIG. 1, the die pad 102 is of a rectangular shape and situated about in the middle of the outer support frame 106. The lead fingers 104 are arranged in two rows along the longer sides of the die pad 102. An arrangement in two rows is for example used in small-outline integrated circuit (SOIC) packages and in small-outline packages (SOP) having leads protruding from two sides of the package. Although FIG. 1 shows only six lead fingers 104, another number of lead fingers, for example 8, 10, 14 or more or less leads are possible. A possible arrangement in four rows along the four sides of a rectangle or more specifically along a square is used for example for quad flat packages.

A rectangle 112 drawn with a dashed line indicates a possible outline of a housing molded in a later process step over a die (not shown in FIG. 1) and part of the lead frame 100.

The die pad 102 is adapted to accommodate a die. The die pad 102 has the form and dimensions to place a chip (die) on it and more specifically a chip for which the lead frame 100 is designated. The die pad 102 may have any form adapted to the specific chip or even to several chips to be placed on the die pad 102. The die pad 102 is not limited to a rectangular shape.

Each lead finger 104 includes an inner portion 104a directed to the die pad 102 and an outer portion 104b extending away from the die pad 102. At least part of the outer portion 104b will project outside the housing.

Each outer portion 104b includes an attach portion 114 at the end of the lead finger facing (or showing) away from the inner portion 104a. Each attach portion 114 includes an opening 116 which extends through the lead frame 100. The openings 116 are through-holes. The openings 116 have an essentially rectangular shape. In the embodiment shown in FIG. 1, the openings 116 are about in the middle of the attach portions 114. It is to be understood that in other embodiments, the openings 116 may have other shapes and may be situated out of the center of the attach portions 114.

The lead frame 100 may be formed out of a metal sheet by etching or stamping out. A suitable metal for the lead frame 100 is copper, however, other materials and even nonmetallic materials may be used. A suitable copper-iron alloy which may be used is C194 ESH (Extra Spring Hard). A suitable copper-nickel alloy which may be used is C7025. All structures of the lead frame 100 can be produced in one etching or stamping process independently of the structure, number of lead fingers, dimensions, etc. A lead frame according to the invention therefore requires only a change in the etching mask or in the stamp form. The production costs of the lead frame 100 are otherwise not increased. However, it is also possible to form the openings 116 in a separate step on an already stamped out or etched lead frame 100, e.g. by laser cutting.

A die is attached to the die pad 102, for example by glue. The die may also be soldered to the die pad 102. Other methods of attachment are possible, dependent essentially on the kind of die. The die pad 102 should be adapted (or configured) to the attachment used. The die pad 102 may be covered by a suitable material for facilitating or enabling the attachment.

An electrical connection will be provided between contact pads of the die, which is attached to the die pad 102, and the inner portions 104a of the lead fingers 104. The electrical connections may be provided by bond wires. The inner portions 104a of the lead fingers 104 are adapted to provide a good bond connection. The inner portions 104a may be provided with a coverage adapted for bonding.

The attach portion 114 will be soldered to an external solder pad. The attach portion 114 is therefore adapted to a soldering process and may be plated for a better solderability. Suitable materials to enhance solderability are gold, silver, platinum, zinc, tin, nickel, copper and alloys of these metals. A suitable alloy is for example nickel-palladium-silver/gold. A plating process may be limited to the attach portions or encompass the whole lead frame. A plating process also covers the inner walls of the openings 116. The same material may be used to adapt the inner portions 104a for bonding and the attach portions 114 for solderability. Electroplating may be used to plate the lead frame 100.

Figure 2:
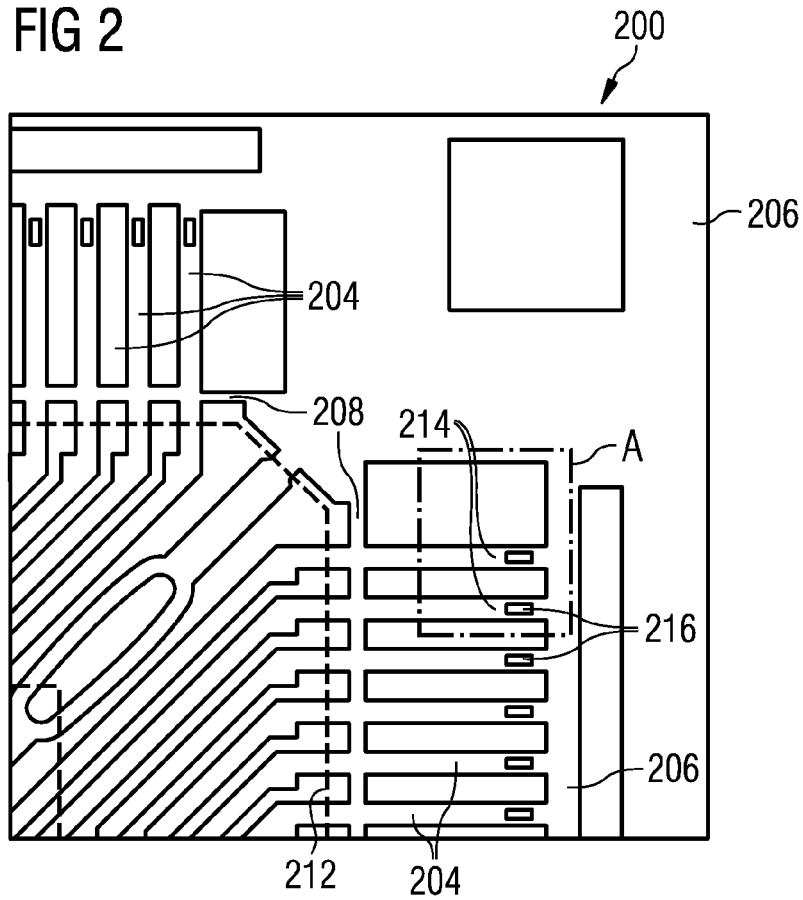
FIG. 2 schematically illustrates a part of a lead frame according to a second embodiment.

FIG. 2 shows part of a lead frame 200 according to a second embodiment. The lead frame 200 is intended for a quad flat package. Lead fingers 204 are arranged in four rows along four sides of a die pad (not shown). Attach portions 214 at the end of outer portions of the lead fingers 204 include through-openings 216, i.e. openings extending through a thickness of the lead fingers 204 or more precisely through a thickness of the attach portions 214. The through-openings 216 may extend from an upper surface of the lead fingers 204 to a lower surface of the lead fingers 204 or more precisely from an upper surface of the attach portions 214 to a lower surface of the attach portions 214. The lead fingers 204 are attached to each other by support bars 208. The lead fingers 204 are attached to a surrounding support frame 206. The support bars 208 and the support frame 206 assure stability during processing and are removed afterwards. A dashed line 212 indicates a possible outline of a housing.

Figure 3:
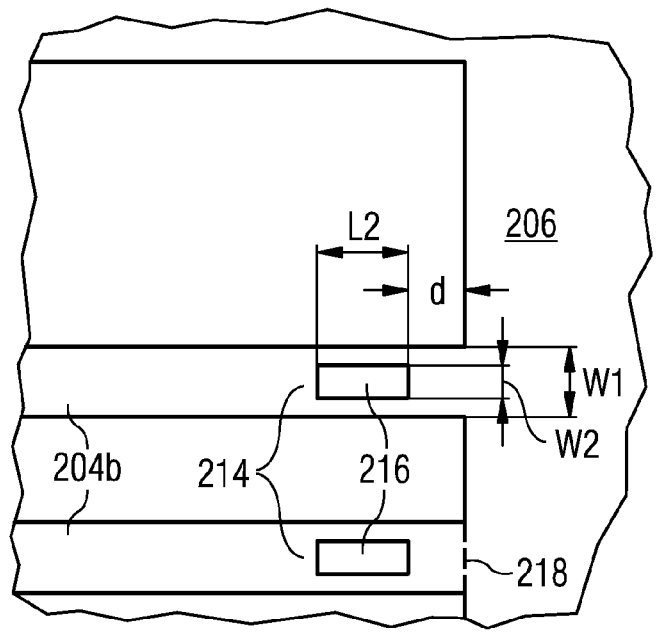
FIG. 3 schematically illustrates a detail of FIG. 2.

FIG. 3 shows a detail A of FIG. 2. FIG. 3 shows two outer portions 204b of two lead fingers 204. The two attach portions 214 include an opening 216 each through the thickness of the attach portion 214. In the second embodiment shown in FIG. 2 and FIG. 3, an attach portion 214 of a lead finger 204 has a width w1. Opening 216 has a width w2 and is distant by a distance d from an end edge 218 of the lead finger 204. The end edge 218 is indicated by a dashed line, as the lead finger 204 is still attached to surrounding support frame 206.

Width w1 of the attach portion 214 may be 0.2 mm with a tolerance of about +/−0.025 mm and width w2 of the opening 216 may be 0.1 mm. Thus, width w2 is about half of width w1. Width w2 may also be smaller than 0.1 mm. Width w2 may be e.g. 0.09 mm, 0.08 mm or 0.075 mm. The remaining web of the attach portion 214 on both sides of the opening 216 is 0.05 mm when width w2 is 0.1 mm. The opening 216 may have a length l2 of 0.25 mm. The length l2 may be included between 0.1 mm and 0.5 mm. The distance d to the end edge 218 may be 0.15 mm. Preferably, the opening 216 is at least surrounded by a remaining web of 0.05 mm of the attach portion 214 to all lead finger edges to assure stability of the attach portion 214. Thickness t of the attach portion 214 may be 0.1 mm, more specifically thickness t may be 6 mils, i.e. 0.006 inch, i.e. 0.15 mm or 5 mils, i.e. 0.005 inch, i.e. 0.125 mm when using usual lead thicknesses. Thickness t may be between 0.06 mm and 0.2 mm. Plating thickness may be between 0.008 and 0.010 mm.

Figure 4:
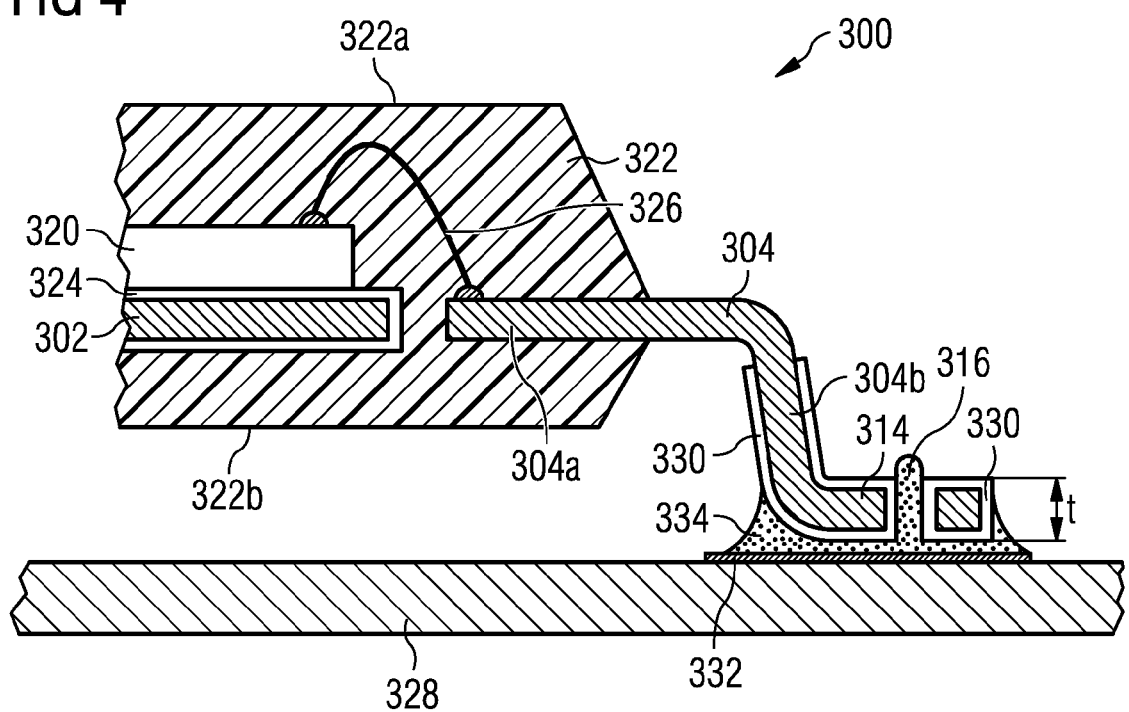
FIG. 4 schematically illustrates a cross-section of a semiconductor package according to a third embodiment.

FIG. 4 shows a cross section through part of a semiconductor package 300 according to a third embodiment. The semiconductor package 300 includes a die pad 302, a lead finger 304, a die 320 and a housing 322. The die pad 302 includes a layer 324 enhancing attachment of the die 320 to the die pad 302. The die 320 is attached to the die pad 302. The housing 322 has an upper surface 322a above the die 320 and a lower surface 322b below the die pad 302. The semiconductor package 300 is mounted for example to a printed circuit 328 and the lower surface 322b is facing the printed circuit 328.

The lead finger 304 includes an inner portion 304a and an outer portion 304b. The inner portion 304a is inside the housing 322, i.e. encapsulated by the housing 322. The inner portion 304a is adapted to provide a good bond connection. A bond wire 326 is bonded to a contact pad (not shown) of the die 320 and to the inner portion 304a of the lead finger 304. The bond wire 326 provides an electrical connection between the die 320 and the lead finger 304. When the die 320 is attached to the die pad 302 and connected electrically to the inner portion 304a, the housing 322 is formed. The housing 322 encapsulates the die 320, the bond wire 326 and the inner portion 304a to protect them against outer influences. The housing 322 may be formed of a plastic material in a molding process.

The outer portion 304b of the lead finger 304 is bent to form a so-called gull-wing lead, i.e. the outer portion 304b protrudes straight out of the housing 322 and is then bent to a curve describing an angle of about 90° to 135° to the lower surface 322b of the housing 322. The end of the lead finger 304 is bent in a second curve to face (or show) away from the housing 322 and to be approximately parallel to the inner portion 304a and the die pad 302.

The outer portion 304b includes an attach portion 314 at the end of the lead finger 304 facing away from the inner portion 304a. The attach portion 314 includes an opening 316 extending through a thickness t of the attach portion 314. The outer portion 304b and more specifically the attach portion 314 and the opening 316 are covered or plated with a solderability enhancement layer 330. All dimensions for the attach portion 314 and the opening 316 may be the same as discussed above with reference to the second embodiment. Also all materials discussed previously may be used in the third embodiment as well.

The printed circuit board 328 includes external circuitry to which the semiconductor package 300 is to be connected. More specifically, the printed circuit board 328 includes a solder pad 332 to which the attach portion 314 is soldered by solder 334. Soldering may be effectuated by any known solder process adapted to a surface mounted component. Possible solder methods include a reflow solder process. In a reflow solder process a solder paste is applied to the solder pad 332 to which the attach portion 314 sticks. In a subsequent heating process the solder paste melts to form a solder joint. While the solder paste is liquid, it is wetting the solderable surfaces of the attach portion 314 and the opening 316. A solder joint is not only formed on the side of the attach portion 314 facing the external solder pad 332, but also inside the opening 316. A solder "stub" inside the opening 316 is thus formed providing an additional lock between printed the circuit board 328 and the semiconductor package 300. Consequently, temperature changes influence less the interconnection between the attach portion 314 and the solder pad 332. Therefore, cracks in the solder joint occur more rarely or even only exceptionally.

Figure 5:
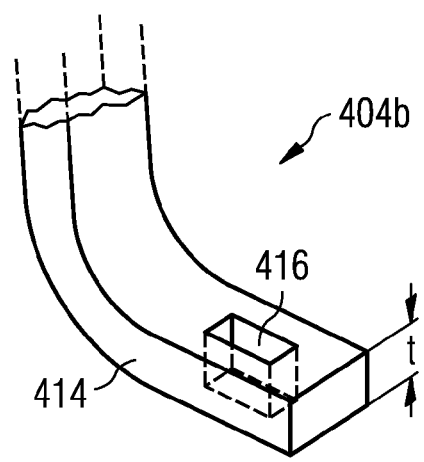
FIG. 5 schematically illustrates in a perspective view an attach portion of a lead finger according to one of the first to third embodiments.

FIG. 5 shows a perspective view of an outer portion 404b of a lead finger according to one of the first to third embodiments. The outer portion 404b is bent to get a mounting surface of an attach portion 414 which can be surface mounted onto a solder pad of a circuit board. An opening 416 is distant from all edges of the attach portion 414. The opening 416 extends through the thickness of the attach portion 414 so that solder can mount in the opening 416 from a solder pad. The opening 416 is of a rectangular shape. However, any other shape is possible as well, including a circular shape, a square shape or any polygonal shape. The attach portion 414 includes only one opening 416. However, more than one opening 416 may be provided. Number, shape and dimensions of opening(s) 416 are only limited by a remaining attach portion with webs of at least about 0.05 mm to maintain stability. The inner walls of the opening 416 have a solderable surface to assure wetting by solder. Solder will mount in the opening 416. Solder may fill half of the opening 416, all of the opening or even protrude out of the opening 416 as shown in the example of FIG. 4. The attach portion 414 may be plated as discussed above.

The opening 416 is shown distant to all edges. In another embodiment, the opening 416 may extend to the end edge of the attach portion 414 providing a slit attach portion.

Figure 6:
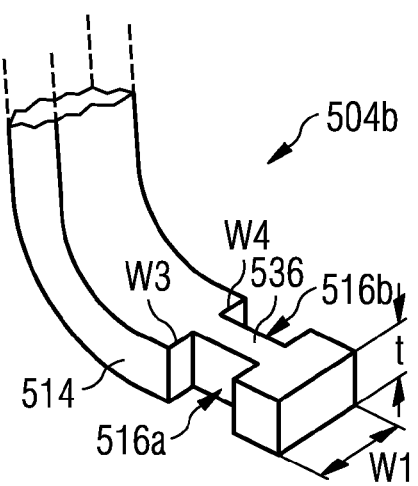
FIG. 6 schematically illustrates in a perspective view an attach portion of a lead finger according to a fourth embodiment.

FIG. 6 shows a perspective view of an outer portion 504b of a lead finger according to a fourth embodiment. An attach portion 514 includes two openings (or recesses or grooves) 516a, 516b extending through a thickness t of the attach portion 514. The openings 516a, 516b are not distant to an edge of the attach portion 514. First opening 516a includes a first side edge of the attach portion 514 and second opening 516b includes a second side edge of the attach portion 514 opposite the first side edge. Between the first opening 516a and the second opening 516b is a remaining portion 536 of the attach portion 514. Walls surrounding the first and second openings 516a, 516b have a solderable surface. When soldering the attach portion 514 to a solder pad, solder mounts in both of the openings 516a, 516b providing two solder "stubs".

The first opening 516a has a width w3 measured from the first edge to the remaining portion. The second opening 516b has a width w4 measured from the second edge to the remaining portion. The attach portion 514 has a width w1. Width w3 and width w4 may have together half of the width of w1. Width w3 and width w4 may be equal. The openings 516a and 516b have a length l2.

In an exemplary embodiment, w1 is 0.2 mm and w3 and w4 are 0.05 mm each. Thus, the remaining portion 536 has a width of 0.1 mm. Length l2 may be 0.25 mm for a length l1 of the attach portion 514 of 0.6 mm. In other embodiments, width w3 and width w4 may be different from each other. The openings 516a and 516b may also differ in length. They can be staggered, i.e. not being directly opposite each other. In an embodiment, for one attach portion two openings may be provided, more specifically, an opening including an edge may be combined with an opening which is distant from all edges like opening 416 in FIG. 5. It is to be understood, that for other widths and lengths of the attach portion, the dimensions of the opening(s) may differ.

Figure 7:
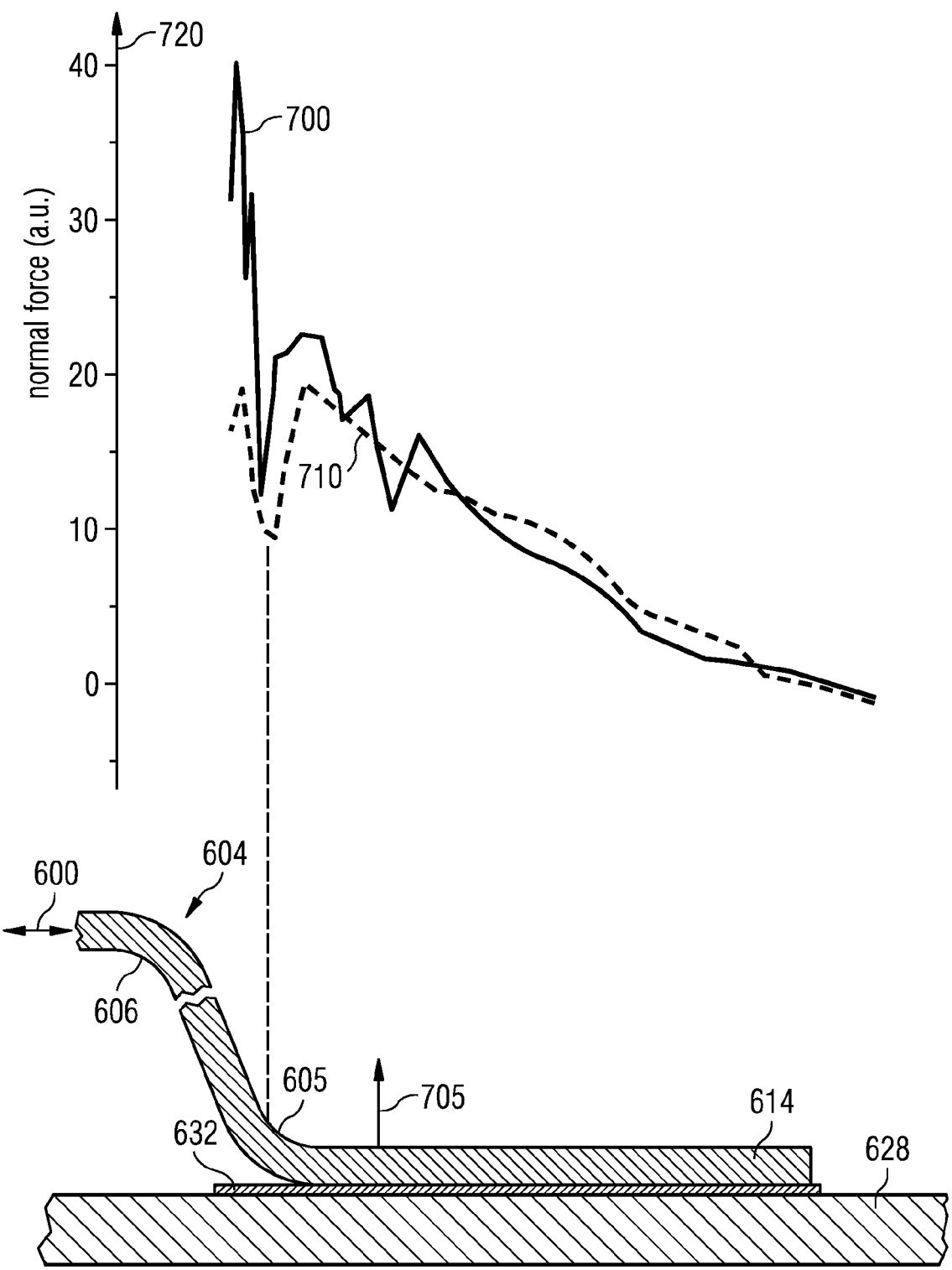
FIG. 7 schematically illustrates a simulation result for a normal force acting on an attach portion along a lead finger of prior art and along a lead finger according to one of the first to third embodiments.

Simulation results confirm that an opening through the attach portion of a lead finger as discussed above reduces considerably normal force strength acting on the solder joint. The opening is at least partly filled with solder during a surface mount solder process. The simulation results are illustrated in FIG. 7. A diagram shows a line 700 and a line 710. Line 700 represents the strength of normal forces acting on a lead finger without an opening through the thickness of the attach portion of the lead finger. Line 710 represents the strength of normal forces acting on a lead finger according to one of the first to third embodiments. A vertical axis 720 shows the strength in arbitrary units which may be MPa.

In FIG. 7 a schematically indicated lead finger 604 is bent in a curve 605 and a curve 606 to a gull-wing lead. Curve 605 next to the attach portion is of the lead finger 604 is also called "heel" of the lead. An attach portion is simulated to be soldered to a solder pad 632 on a circuit board 628. The lead finger 604 is meant to represent both lead fingers under simulation, i.e. one of prior art and one with a through-hole according to one of the first to third embodiments. A simulated force 600 is acting on the inner portion of the lead finger 604 near the housing (not shown) parallel to the circuit board 628. Force 600 represents real forces acting on the leads during e.g. temperature changes but also due to vibration or other circumstances. Force 600 causes a normal force 705, i.e. a force perpendicular to the circuit board 628, on the lead finger 604. Normal force 705 varies along the length of the lead finger 604. This variation over the lead finger 604 is plotted in lines 700 and 710. The values on vertical axis 720 can be considered to be in MPa assuming a simulated force 600 of 1 MPa.

A comparison between lines 700 and 710 shows clearly that the normal force acting on the lead finger 604 between the two curves 605 and 606, i.e. near the heel is considerably reduced for a lead finger in accordance with the disclosure. In one simulation, it was reduced from 44.0 MPa for a conventional lead finger to 19.3 MPa for a lead finger according to one of the first to third embodiments. For a lead finger according to the fourth embodiment, the normal force was still reduced to 21.1 MPa. Due to the different designs, the force acts under different angles.

In addition, devices in accordance with the disclosure may withstand temperature cycles with considerably less cracks in the solder joint. If any cracks arise they are less important, i.e. shorter than the cracks produced during temperature cycles for conventional leads.

While the invention has been illustrated and described with respect to one or more implementations, alterations and/or modifications may be made to the illustrated examples without departing from the spirit and scope of the appended claims. In particular regard to the various functions performed by the above described structures, the terms (including a reference to a "means") used to describe such structures are intended to correspond, unless otherwise indicated, to any structure which performs the specified function of the described structure (e.g., that is functionally equivalent), even though not structurally equivalent to the disclosed structure which performs the function in the herein illustrated exemplary implementations of the invention.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
a lead frame comprising:
a die pad configured to accommodate a die;
a lead finger comprising:
an inner portion configured to be electrically coupled to contact pads of the die; and
an outer portion comprising an attach portion at an end of the lead finger facing away from the inner portion, the attach portion being configured to be soldered to an external solder pad, wherein the attach portion comprises a first width, a length and a thickness, and wherein an opening extends through the thickness of the attach portion;
a die attached to the die pad and electrically coupled to the inner portion of the lead finger; and
a housing encapsulating the die and the inner portion of the lead finger,
wherein the outer portion of the lead finger is bent to form a gull-wing lead.

2. The semiconductor package of claim 1, wherein the attach portion is substantially rectangular and the opening comprises a second width which is about half of the first width of the attach portion.

3. The semiconductor package of claim 1, wherein the opening is surrounded by side walls formed by the attach portion, and the attach portion comprises a solderability enhancement layer deposited on a surface of the attach portion and on the side walls of the opening.

4. A semiconductor package, comprising:
a lead frame comprising:
a die pad configured to accommodate a die;
a lead finger comprising:
an inner portion configured to be electrically coupled to contact pads of the die; and
an outer portion comprising an attach portion at an end of the lead finger facing away from the inner portion, the attach portion being configured to be soldered to an external solder pad, wherein the attach portion comprises a first width, a length and a thickness, and wherein an opening extends through the thickness of the attach portion;
a die attached to the die pad and electrically coupled to the inner portion of the lead finger; and
a housing encapsulating the die and the inner portion of the lead finger,
wherein the attach portion is substantially rectangular and the opening comprises a second width which is about half of the first width of the attach portion.

5. The semiconductor package of claim 4, wherein the outer portion of the lead finger is bent to form a gull-wing lead.

6. The semiconductor package of claim 4, wherein the opening is surrounded by side walls formed by the attach portion, and the attach portion comprises a solderability enhancement layer deposited on a surface of the attach portion and on the side walls of the opening.

7. A semiconductor package, comprising:
a lead frame comprising:
a die pad configured to accommodate a die;
a lead finger comprising:
an inner portion configured to be electrically coupled to contact pads of the die; and
an outer portion comprising an attach portion at an end of the lead finger facing away from the inner portion, the attach portion being configured to be soldered to an external solder pad, wherein the attach portion comprises a first width, a length and a thickness, and wherein an opening extends through the thickness of the attach portion;
a die attached to the die pad and electrically coupled to the inner portion of the lead finger; and
a housing encapsulating the die and the inner portion of the lead finger, wherein the opening is surrounded by side walls formed by the attach portion, and the attach portion comprises a solderability enhancement layer deposited on a surface of the attach portion and on the side walls of the opening.

8. The semiconductor package of claim 7, wherein the outer portion of the lead finger is bent to form a gull-wing lead.

9. The semiconductor package of claim 7, wherein the attach portion is substantially rectangular and the opening comprises a second width which is about half of the first width of the attach portion.

* * * * *